United States Patent
Ramkumar et al.

(10) Patent No.: US 6,555,484 B1
(45) Date of Patent: *Apr. 29, 2003

(54) METHOD FOR CONTROLLING THE OXIDATION OF IMPLANTED SILICON

(75) Inventors: Krishnaswamy Ramkumar, San Jose, CA (US); Hanna Bamnolker, San Jose, CA (US)

(73) Assignee: Cypress Semiconductor Corp., San Jose, CA (US)

(*) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 08/878,728

(22) Filed: Jun. 19, 1997

(51) Int. Cl.⁷ ......................... H01L 21/265; H01L 21/44
(52) U.S. Cl. ..................... 438/766; 438/289; 438/514; 438/519; 438/522; 438/911; 438/920; 438/981
(58) Field of Search ............... 438/766, 514, 438/517, 519, 522, 911, 920, 981, 527, 287, 289

(56) References Cited

U.S. PATENT DOCUMENTS

| | | |
|---|---|---|
| 3,430,109 A | 2/1969 | Chou |
| 3,585,714 A | 6/1971 | Chou |
| 4,256,514 A | 3/1981 | Pogge .................. 148/1.5 |
| 4,639,288 A | 1/1987 | Price et al. ............. 156/643 |
| 4,851,361 A * | 7/1989 | Schumann et al. ........ 438/201 |
| 4,916,513 A | 4/1990 | Li .................. 357/50 |
| 4,946,800 A | 8/1990 | Li .................. 437/65 |
| 4,965,221 A | 10/1990 | Dennison et al. ........... 437/70 |
| 4,992,390 A | 2/1991 | Chang ................. 437/42 |
| 5,151,381 A | 9/1992 | Liu et al. ............... 437/69 |
| 5,296,094 A | 3/1994 | Shan et al. .............. 156/651 |
| 5,334,861 A * | 8/1994 | Pfiester et al. ............ 257/67 |
| 5,393,679 A * | 2/1995 | Yang ................. 438/217 |
| 5,431,778 A | 7/1995 | Dahm et al. ........... 156/662.1 |
| 5,443,998 A * | 8/1995 | Meyer ................ 438/763 |
| 5,447,884 A | 9/1995 | Fahey et al. ............. 437/67 |

(List continued on next page.)

FOREIGN PATENT DOCUMENTS

| | | |
|---|---|---|
| JP | 53-65086 | 10/1978 |
| JP | 54124986 | 9/1979 |
| JP | 60-116146 | 6/1985 |
| JP | 61-135136 | 6/1986 |

OTHER PUBLICATIONS

US 5,679,486, 10/1997, Maurer (withdrawn)*
Silicon Processing for the VLSI Era, Wolf Stanley, vol. 1, pp. 280–282, 1986.*
Silicon Processing for the VLSI Era, Wolf Stanley, vol. 2, pp. 331–332, 1990.*
Silico Processing for the VLSI Era, Wolf Stanley, vol. 1, pp. 280–282, 1986.*

(List continued on next page.)

Primary Examiner—Carl Whitehead, Jr.
Assistant Examiner—Thanh Nguyen
(74) Attorney, Agent, or Firm—Sonnenschein Nath & Rosenthal

(57) ABSTRACT

Two different regions of a semiconductor substrate are implanted with dopants/ions. The implantation may occur though a sacrificial oxide layer disposed over the substrate. Following implantation in one or both regions, the substrate may be annealed and the sacrificial oxide layer removed. An oxide layer is then grown over the implanted regions of the substrate. For some embodiments, the substrate may be implanted with arsenic and/or with phosphorus. Further, the anneal may be performed for approximately 30 to 120 minutes at a temperature between approximately 900° C. and 950° C.

18 Claims, 2 Drawing Sheets

U.S. PATENT DOCUMENTS

| | | | | |
|---|---|---|---|---|
| 5,498,577 A | * | 3/1996 | Fulford, Jr. et al. | 438/703 |
| 5,672,521 A | * | 9/1997 | Barsan et al. | 438/981 |
| 5,679,483 A | * | 10/1997 | Maurer | 430/5 |
| 5,688,701 A | * | 11/1997 | Kobayashi et al. | 438/289 |
| 5,702,988 A | * | 12/1997 | Liang | 438/238 |
| 5,739,056 A | * | 4/1998 | Dennison et al. | 438/238 |
| 5,750,428 A | * | 5/1998 | Chang | 438/264 |
| 5,792,680 A | * | 8/1998 | Sung et al. | 438/210 |
| 5,795,803 A | * | 8/1998 | Takamura et al. | 438/228 |
| 5,869,385 A | | 2/1999 | Tang et al. | |
| 5,900,658 A | * | 5/1999 | Lee et al. | 257/596 |

OTHER PUBLICATIONS

Silicon Processing for the VLSI Era, Wolf Stanley, vol. 1, pp. 219–220, 1986.*

Wolf "Silicon Processing for the VLSI Era" pp. 331–332, vol. 2, 1990.*

Wolf"silicon processing for the VLSI Era" pp. 280–282, vol. 1, 1986.*

Stanley Wolf Ph.D, "Silicon Processing For the VLSI ERA", *Process Technology*, vol. 1, pp. 528–534, (1986).

* cited by examiner

METHOD FOR CONTROLLING THE OXIDATION OF IMPLANTED SILICON

FIELD OF THE INVENTION

The present invention relates to the growth of oxides on semiconductors and, in particular, relates to the differential growth of oxide layers over implanted areas of a silicon based substrate.

BACKGROUND

In the manufacture of semiconductor devices, thin layers of gate oxide are grown over active areas. It has long been known that slow oxide growth rates should be used to reproducibly grow quality thin oxide films of proper thicknesses over semiconductor dies. However, with the advent of new technologies there has been a need grow gate oxide layers of different thicknesses on different sections of a given semiconductor die. For example, in the manufacture of programmable devices some areas of a semiconductor die on a wafer may require gate oxide thicknesses of between 70 Å and 80 Å. In other areas on the same semiconductor die, however, gate oxide thicknesses of 150 Å to 180 Å may be required. Historically, it has been difficult to control the proper oxide thicknesses within the separate regions of a given semiconductor die or wafer using conventional oxide growth methods.

In other applications, again in the manufacture of programmable devices, thin oxide layers are to be grown over areas of silicon that have been heavily doped. Oxidation rates for such areas are typically very much higher than for areas of undoped silicon. For example, areas of silicon that have been doped with phosphorus will exhibit an affinity for oxygen and so such areas of a semiconductor die will tend to oxidize much more quickly than undoped areas. Indeed, oxide growth rates over heavily doped areas of a semiconductor die have been observed that are five times faster than growth rates in undoped areas of the same semiconductor die.

Because of the need to precisely control the thickness of the gate oxide layer, there is a need to be able to control the oxidation rate over areas of heavily doped silicon. Ideally, one would like to keep the oxidation rate over such heavily doped areas approximately the same as the oxidation rate over undoped areas. This would provide for a very controlled oxide growth step during processing of the semiconductor die. At the very least, the oxidation rate for the heavily doped areas of silicon should be predictable and controllable.

SUMMARY OF THE INVENTION

The present invention provides, in one embodiment, a method of controlling the oxidation rate in a semiconductor die. Two different regions of the semiconductor die are implanted with different amounts of dopants/ions. The implantation may occur though a sacrificial oxide layer disposed over the semiconductor die. Following implantation in one or both regions, the semiconductor die may be annealed and the sacrificial oxide layer may be removed. An oxide layer may then be grown over the implanted region(s) of the semiconductor die.

For some embodiments, the semiconductor die may be implanted with arsenic and/or with phosphorus. Further, the anneal may be performed for approximately 30 to 120 minutes at a temperature between approximately 900° C. and 950° C.

BRIEF DESCRIPTION OF THE DRAWING

The present invention is illustrated by way of example, and not limitation, in the figures of the accompanying drawing in which.

DETAILED DESCRIPTION

Described herein is a method of controlling the oxidation rate in a semiconductor die. A region of the semiconductor die may be implanted with dopants/ions through a sacrificial oxide layer disposed over the die. Following the implantation, the semiconductor die may be annealed, for example at a temperature of between approximately 900° C. and 950° C. for approximately 30 to 120 minutes. Following the anneal, the sacrificial oxide layer may be stripped and a gate oxide layer grown over the area of the implantation. Although described with reference to certain specific illustrated embodiments, those skilled in the art will recognize that the present invention is applicable to a wide variety of silicon processing applications. Accordingly, the embodiments discussed below should be regarded as illustrative only.

In certain technologies, for example in the manufacture of electrically erasable programmable read only memories (EEPROMs), a heavily doped N layer (often referred to as the buried N+ layer) is used under the tunnel oxide layer for programming. The high level of doping (e.g., on the order of $10^{19}$ ions/cm$^3$) in such areas usually leads to a significantly enhanced oxidation rate over this area of the semiconductor die, especially when the oxidation is performed in a steam environment. The present invention provides a method of controlling the enhancement of this oxidation rate.

In accordance with one embodiment of the present invention, the oxidation rate for areas of heavily implanted silicon can be reduced significantly by annealing the implanted wafer, with a sacrificial oxide layer present, at temperatures in the range of approximately 900° C. to 950° C. for approximately 30 to 120 minutes, preferably 30 to 60 minutes. Depending on the time and temperature, the oxidation enhancement decreases from approximately two times that of the oxidation rate which would be observed without such an anneal to approximately 1.15 times, for an arsenic doping of $4\times10^{14}$cm$^{-2}$ at 70 KeV. If the sacrificial oxide layer is removed prior to the oxide growth, the oxidation rate enhancement increases, especially if an anneal is performed prior to the oxidation in the fabrication process. Rate enhancement can be as high as 2.8 times that of conventional oxide growth rates with an anneal prior to oxidation. Thus, according to one embodiment of the present invention the oxidation rate enhancement on implanted silicon can be controlled anywhere between 1.15 and 2.8 times that of an oxide growth rate on bare silicon.

Figure 1A:
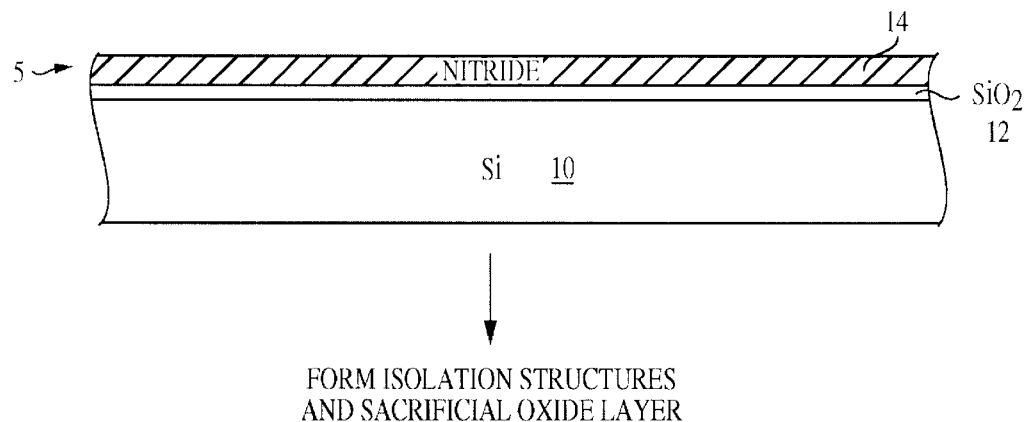
FIGS. 1(a)–1(d) illustrate structures formed after various steps in the processing of a semiconductor in accordance with one embodiment of the present invention.
Figure 1B:
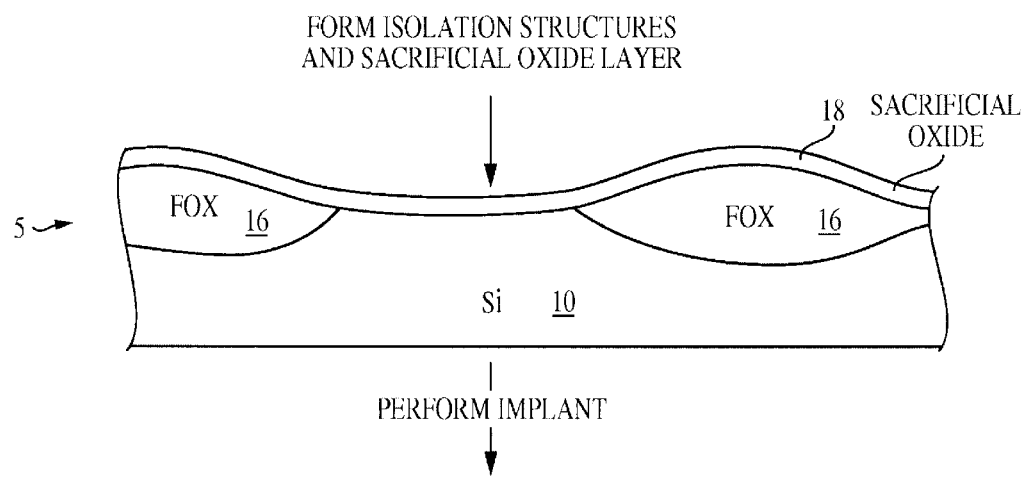
Figure 1C:
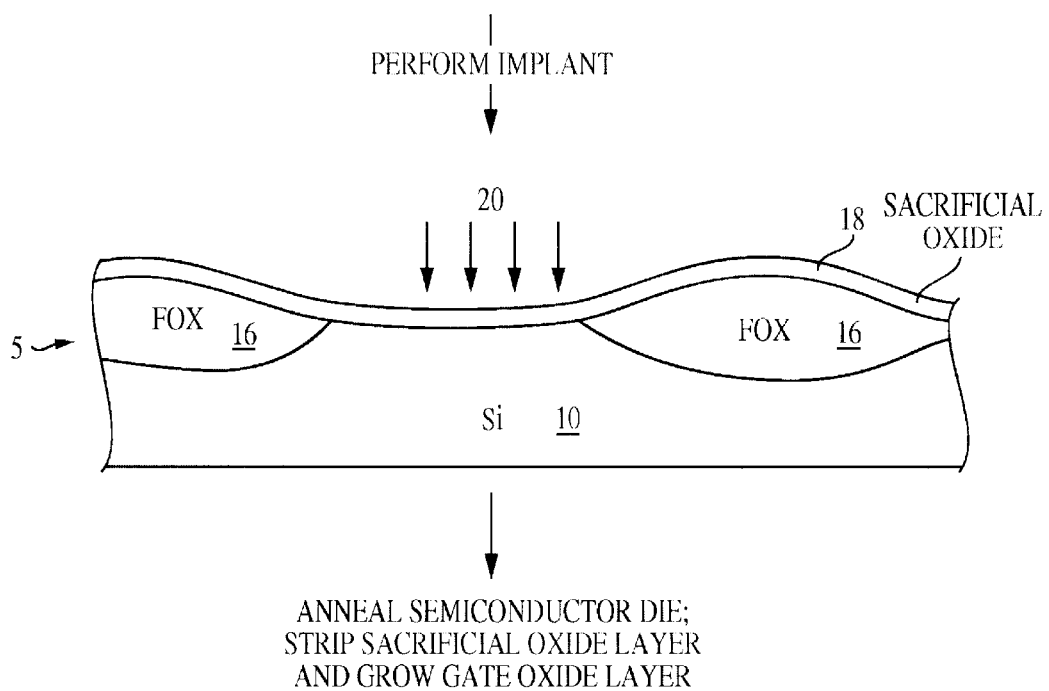
Figure 1D:
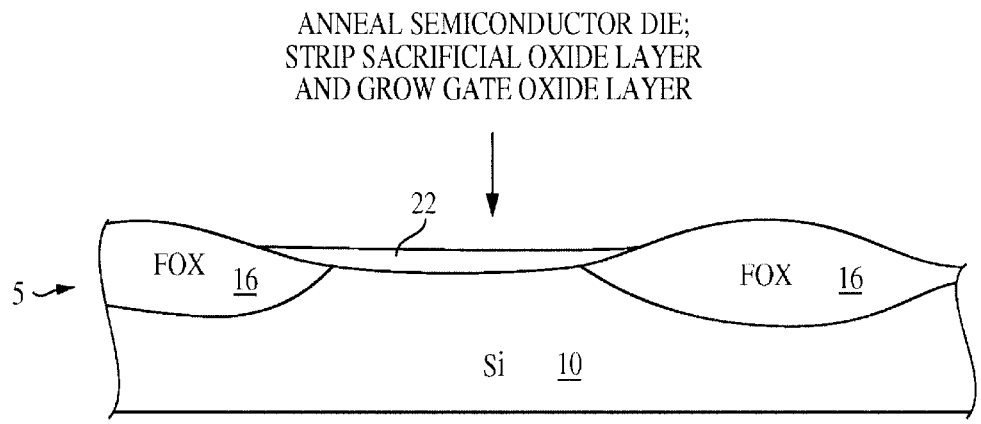

As illustrated in FIGS. 1(a)–1(d), the present invention uses a number of processing steps to achieve control of the enhancement in oxidation rate. First, as shown in FIG. 1(a), for a semiconductor die 5 which includes a semiconductor substrate 10 (which may comprise silicon) and a pad oxide layer 12 disposed over the substrate 10, a nitride layer 14 may be deposited prior to the formation of isolation structures in the semiconductor die 5. The substrate 10 may be any conventional silicon-based semiconductor, such as silicon, N- or P-doped silicon, silicon-germanium, a silicon-based semiconductor-on-insulator structure, etc., but is preferably silicon or silicon doped with up to $10^{15}$ atoms/cm$^3$ of phosphorous or arsenic. The isolation structures 16 may comprise a field oxide layer which is fabricated in accordance with conventional local oxidation of silicon (LOCOS) isolation techniques. Once the isolation structures have been formed, a sacrificial oxide layer 18 may be grown over the isolation structures and the substrate 10 as shown in FIG. 1(*b*).

Following growth of the sacrificial oxide layer 18, the substrate 10 may be implanted with one or more dopants 20 during an implanting step (e.g., a buried N+ implant) as shown in FIG. 1(*c*). Suitable dopants include arsenic (As), phosphorus (P), boron (B), antimony (Sb), gallium (Ga) and indium (In), As and/or P being preferred. Suitable doping levels may be from $10^{12}$ to $5 \times 10^{15}$ cm$^{-2}$, preferably from $10^{13}$ to $5 \times 10^{15}$ cm$^{-2}$, at an energy of from 30 to 100 KeV, preferably 40 to 80 KeV. Following the implant, the semiconductor die may be annealed (e.g., at a temperature of between 700 to 1100° C., preferably 800 to 1000° C. and more preferably 850 to 970° C.), for a period of time sufficient to diffuse the dopant a desired and/or predetermined depth into the substrate. The sacrificial oxide layer 18 may then be stripped and a gate oxide layer 22 may then be grown in the active region (e.g., simultaneously over different regions within the semiconductors the different regions having different implants) as shown in FIG. 1(*d*).

Table 1 below provides the results of various processes performed according to the present invention for a gate oxide thickness of 150 Å. As shown, implants of both arsenic (As) and phosphorus (P) were performed at various dose levels and energies. Anneals were performed at temperatures of 900° C. and 950° C. to provide comparison with oxidation which was performed without anneal. The results of the differential oxidation rates as compared to the oxidation rate when performed without anneal are presented.

TABLE 1

| Implant Species | Dose (cm$^{-2}$) | Energy (KeV) | Anneal (° C.) | Oxidation | Differential oxidation |
|---|---|---|---|---|---|
| As | 5E + 13 | 70 | No | Wet | 1.1 |
|  | 5E + 13 | 70 | 900 | Wet | 1.0 |
|  | 5E + 13 | 70 | 950 | Wet | 1.0 |
| As | 1E + 14 | 50 | No | Wet | 1.2 |
|  | 1E + 14 | 50 | 900 | Wet | 1.0 |
|  | 1E + 14 | 50 | 950 | Wet | 1.0 |
| P | 5E + 13 | 50 | No | Wet | 1.7 |
|  | 5E + 13 | 50 | 900 | Wet | 1.2 |
|  | 5E + 13 | 50 | 950 | Wet | 1.1 |
| As | 4E + 14 | 70 | No | Dry | 1.4 |
|  | 4E + 14 | 70 | 900 | Dry | 1.1 |
|  | 4E + 14 | 70 | 950 | Dry | 1.0 |
| As | 4E + 14 | 50 | No | Dry | 1.5 |
|  | 4E + 14 | 50 | 900 | Dry | 1.1 |
|  | 4E + 14 | 50 | 950 | Dry | 1.0 |

This table shows that an anneal performed after the implant, with the sacrificial oxide intact, decreases the oxidation rate enhancement significantly.

In an alternative embodiment of the present invention for increasing the oxidation enhancement, the annealing step may be omitted. A semiconductor substrate comprising silicon and having a pad oxide layer disposed thereover is patterned with a nitride layer. Conventional LOCOS isolation structures are formed and, thereafter, a sacrificial oxide layer is grown. Ion implantation is then performed, for example using arsenic or phosphorus ions. Following implantation, the sacrificial oxide layer is stripped and the gate oxide layer is grown in the active region.

An experiment was carried out to determine the differential oxide growth rates for buried N+ implants using different dose/energy combinations. To determine the effect of an anneal prior to gate oxidation, different anneal times at 950° C. were used and compared to oxide thicknesses and growth rates without an anneal step. Wet oxidation (i.e., a water-containing [steam] environment that may be generated in situ from hydrogen and oxygen gases) was used to provide a high quality oxide. Table 2 summarizes the thicknesses for the different cases and the relative ratios to identically processed, non-implanted die.

TABLE 2

| Wafer # | As implant | P implant | Thickness | Ratio |
|---|---|---|---|---|
| (a) With 120 min. anneal @ 950° C. before oxidation. | | | | |
| TW | — | — | 94.1 | — |
| 3 | — | — | 91.6 | — |
| 4 | — | — | 90.0 | — |
| 7 | 4E14 50 Kev | 5E13 50 Kev | 248 | 2.75 |
| 10 | 4E14 70 Kev | 5E13 50 Kev | 218 | 2.42 |
| 13 | 4E14 90 Kev | 5E13 50 Kev | 188 | 2.09 |
| 16 | 1E14 50 Kev | 5E13 50 Kev | 127 | 1.41 |
| 19 | 1E14 70 Kev | 5E13 50 Kev | 120 | 1.33 |
| 22 | 1E14 90 Kev | 5E13 50 Kev | 113 | 1.25 |
| (b) With 30 min. anneal @ 950° C. before oxidation. | | | | |
| TW | — | — | 92.3 | — |
| 2 | — | — | 88.1 | — |
| 6 | 4E14 50 Kev | 5E13 50 Kev | 243 | 2.76 |
| 9 | 4E14 70 Kev | 5E13 50 Kev | 202 | 2.29 |
| 12 | 4E14 90 Kev | 5E13 50 Kev | 168 | 1.90 |
| 15 | 4E14 50 Kev | 5E13 50 Kev | 123 | 1.39 |
| 18 | 1E14 70 Kev | 5E13 50 Kev | 114 | 1.29 |
| 21 | 1E14 90 Kev | 5E13 50 Kev | 110 | 1.25 |
| (c) With no anneal before oxidation. | | | | |
| TW | — | — | 74.6 | — |
| 1 | — | — | 73.8 | — |
| 5 | 4E14 50 Kev | 5E13 50 Kev | 163 | 2.21 |
| 8 | 4E14 70 Kev | 5E13 50 Kev | 127 | 1.72 |
| 11 | 4E14 90 Kev | 5E13 50 Kev | 107 | 1.45 |
| 14 | 4E14 50 Kev | 5E13 50 Kev | 102 | 1.38 |
| 17 | 1E14 70 Kev | 5E13 50 Kev | 95.8 | 1.29 |
| 20 | 1E14 90 Kev | 5E13 50 Kev | 93.9 | 1.27 |

Table 2 shows that the higher the arsenic dose level, the higher the differential oxidation ratio. For the same dose level, the higher the energy, the lower the differential oxidation ratio. However, when an anneal was performed prior to oxidation, a higher differential oxidation ratio was observed than was present when no anneal was used. It was further observed that the anneal time did not affect the differential oxidation ratio significantly.

From the above, one of ordinary skill in the art can readily determine, without undue experimentation, the implant conditions (e.g., dopant dosage and/or implant energy), the desirability of an annealing step (which may be performed before or after the removal of the sacrificial oxide to effect differential oxide growth), the annealing temperature, etc. to achieve a desired differential growth.

Thus, a method for controlling the enhanced oxidation of heavily implanted silicon has been described. Although discussed with reference to certain specific illustrated embodiments, it should be recognized that the present invention may find application in a wide variety of silicon processing methodologies. Accordingly, the present invention should only be measured in terms of the claims which follow.

What is claimed is:

1. A method, comprising:
   implanting with from $5 \times 10^{13}$ to $10^{19}$ atoms/cm$^3$ of a first dopant of a first conductivity into a first active region of a semiconductor die;

implanting with from $5\times10^{13}$ to $10^{19}$ atoms/cm$^3$ of a second different dopant of said first conductivity into a second, separate active region of said semiconductor die;

annealing said semiconductor die sufficiently to reduce a difference in oxidation rates of said first and second active regions; and simultaneously growing a gate oxide layer over said first and second active regions of said semiconductor die, to different thicknesses.

2. A method as in claim 1 wherein said first and second dopants are selected from the group consisting of arsenic, phosphorous, boron, antimony, gallium and indium.

3. A method as in claim 2 wherein said first dopant comprises Phosphorous ions implanted at a first energy level.

4. A method as in claim 3 wherein said first dopant further comprises Arsenic ions implanted at a second energy level.

5. A method as in claim 1 wherein said step of annealing is performed at a temperature between approximately 700° C. and approximately 1100° C.

6. A method as in claim 5 wherein said step of annealing is performed for a period of approximately 30 minutes to 120 minutes.

7. A method as in claim 1 wherein said step of annealing is performed at a temperature between approximately 900° C. and approximately 950° C.

8. A method as in claim 1 wherein said step of implanting said first dopant is performed under a first set of conditions comprising at least one member from the group consisting of dopant dosage and implant energy and said step of implanting said second dopant is performed under a second set of conditions comprising at least one member selected from the group of consisting of dopant dosage and implant energy, wherein at least one of said first set of conditions differs from a corresponding one of said second set of conditions.

9. A method as in claim 8 wherein said first and second set of conditions comprise (a) dosage of dopant and (b) implant energy.

10. A method as in claim 1 further comprising the step of annealing said substrate between said implanting steps.

11. A method as in claim 1 wherein said first and second dopants are implanted through a sacrificial oxide layer disposed over said substrate.

12. A method as in claim 11 further comprising the step of removing said sacrificial oxide layer before said step of growing said oxide layer.

13. A method as in claim 11 wherein said step of removing said sacrificial oxide layer is performed after said step of annealing.

14. A method as in claim 13 wherein said oxide layer is grown in an environment comprising hydrogen and oxygen.

15. A method, comprising:

implanting a first active region of a semiconductor die with from $5\times10^{13}$ to $10^{19}$ atoms/cm$^3$ of a first dopant of a first conductivity type; followed by implanting a second separate active region of said semiconductor die with from $5\times10^{13}$ to $10^{19}$ atoms/cm$^3$ of a second different dopant of said first conductivity type; followed by annealing said semiconductor die at a temperature of at least 700° C.; followed by growing a gate oxide layer over said first active region and said second active region, to different thicknesses, at the same time.

16. A method, comprising:

implanting with from $5\times10^{13}$ to $10^{19}$ atoms/cm$^3$ of a first dopant of a first conductivity type through a sacrificial oxide layer into a first active region of a semiconductor die;

implanting with from $5\times10^{13}$ to $10^{19}$ atoms/cm$^3$ of a second different dopant of said first conductivity type through said sacrificial oxide layer into a second, separate active region of said semiconductor die;

annealing said semiconductor die sufficiently to reduce a difference in oxidation rates of said first and second active regions;

removing said sacrificial oxide layer from over at least one of said first and second active regions; and simultaneously growing a gate oxide layer over said first and second active regions of said semiconductor die, to different thicknesses.

17. The method of claim 16, wherein said annealing is conducted for a length of time of from 30 to 120 minutes.

18. The method of claim 17, wherein said annealing is conducted at a temperature of from 700 to 1100° C.

* * * * *